(12) United States Patent
Kim et al.

(10) Patent No.: US 12,408,566 B2
(45) Date of Patent: Sep. 2, 2025

(54) VARIABLE RESISTANCE MEMORY DEVICE

(71) Applicant: Samsung Electronics Co., Ltd., Suwon-si (KR)

(72) Inventors: Seyun Kim, Seoul (KR); Jinhong Kim, Seoul (KR); Soichiro Mizusaki, Suwon-si (KR); Jungho Yoon, Yongin-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 265 days.

(21) Appl. No.: 18/338,707

(22) Filed: Jun. 21, 2023

(65) Prior Publication Data

US 2023/0337555 A1    Oct. 19, 2023

Related U.S. Application Data

(63) Continuation of application No. 16/875,119, filed on May 15, 2020, now Pat. No. 11,723,289.

(30) Foreign Application Priority Data

Dec. 27, 2019   (KR) ........................ 10-2019-0176731

(51) Int. Cl.
*H10B 63/00*   (2023.01)
*H10N 70/00*   (2023.01)
*H10N 70/20*   (2023.01)

(52) U.S. Cl.
CPC ........... *H10N 70/231* (2023.02); *H10B 63/80* (2023.02); *H10N 70/8833* (2023.02)

(58) Field of Classification Search
CPC .............................. H10N 63/00; H10N 70/00
See application file for complete search history.

(56) References Cited

U.S. PATENT DOCUMENTS 7,557,385 B2   7/2009   Katoda
8,427,865 B2   4/2013   Shima et al.
(Continued)

FOREIGN PATENT DOCUMENTS

CN   102005536 A   4/2011
CN   102832337 A   12/2012
(Continued)

OTHER PUBLICATIONS

Korean Office Action dated May 17, 2024 for corresponding Korean Patent Application No. 2019/0176731 and its English-language translation.
(Continued)

*Primary Examiner* — Marvin Payen
(74) *Attorney, Agent, or Firm* — HARNESS, DICKEY & PIERCE, P.L.C.

(57) ABSTRACT

A variable resistance memory device includes a variable resistance layer, a first conductive element, and a second conductive element. The variable resistance layer includes a first layer including a first material and a second layer on the first layer and the second layer including a second material. The second material has a different valence than a valence of the first material. The first conductive element and the second conductive element are on the variable resistance layer and separated from each other to form an electric current path in the variable resistance layer in a direction perpendicular to a direction in which the first layer and the second layer are stacked.

20 Claims, 11 Drawing Sheets

(56) References Cited

U.S. PATENT DOCUMENTS

| | | |
|---|---|---|
| 9,093,369 B2 | 7/2015 | Shin et al. |
| 9,484,087 B2 | 11/2016 | Lee et al. |
| 2008/0149913 A1 | 6/2008 | Tanaka et al. |
| 2012/0305882 A1 | 12/2012 | Gu et al. |
| 2013/0010530 A1 | 1/2013 | Katayama et al. |
| 2013/0328005 A1 | 12/2013 | Shin et al. |
| 2014/0097397 A1 | 4/2014 | Park et al. |
| 2014/0145137 A1 | 5/2014 | Ju et al. |
| 2014/0225054 A1 | 8/2014 | Yoneda et al. |
| 2015/0255716 A1 | 9/2015 | Phatak et al. |
| 2016/0225987 A1 | 8/2016 | Huang et al. |
| 2016/0315254 A1 | 10/2016 | Bajaj et al. |
| 2018/0075903 A1 | 3/2018 | Ogiwara et al. |
| 2018/0277759 A1 | 9/2018 | Tachikawa et al. |
| 2019/0088318 A1 | 3/2019 | Morooka |
| 2019/0198760 A1 | 6/2019 | Tachikawa et al. |
| 2020/0209444 A1 | 7/2020 | Wakabayashi et al. |
| 2021/0202840 A1 | 7/2021 | Kim et al. |

FOREIGN PATENT DOCUMENTS

| | | |
|---|---|---|
| CN | 103715354 A | 4/2014 |
| CN | 104733612 A | 6/2015 |
| JP | 2006-202872 A | 8/2006 |
| JP | 2010/173133 A | 8/2010 |
| JP | 2018/160547 A | 10/2018 |
| JP | 2019/054173 A | 4/2019 |
| KR | 2021-0083934 A | 7/2021 |
| WO | 2016/006232 A1 | 1/2016 |
| WO | 2019/077736 A1 | 4/2019 |

OTHER PUBLICATIONS

Chinese Office Action dated Aug. 26, 2024 for corresponding Chinese Patent Application No. 202011549772.2 and its English-language translation.

Japanese Office Action dated Nov. 5, 2024 for corresponding Japanese Patent Application No. 2020-215223 and its English-language translation.

Kanghoon Yim et al., 'Novel high-κ dielectrics for next-generation electronic devices screened by automated ab initio calculations' *NPG Asia Materials* (2015) 7, e190.

Sven Dirkmann et al., 'Filament growth and resistive switching in hafnium oxide memristive devices' *Applied Materials & Interfaces*, Mar. 2018.

Extended European Search Report dated May 12, 2021, issued in corresponding European Patent Application No. 20217254.0.

Japanese Office Action dated Jan. 29, 2024 for corresponding Japanese Patent Application No. 2020-215223 and its English-language translation.

VARIABLE RESISTANCE MEMORY DEVICE

CROSS-REFERENCE TO RELATED APPLICATION

This application is a continuation of U.S. patent application Ser. No. 16/875,119, filed May 15, 2020, which claims the benefit of Korean Patent Application No. 10-2019-0176731, filed on Dec. 27, 2019, in the Korean Intellectual Property Office, the disclosure of each of which is incorporated herein in its entirety by reference.

BACKGROUND

1. Field

The present disclosure relates to non-volatile memory devices including variable resistance materials.

2. Description of Related Art

Non-volatile memory is a semiconductor memory device capable of retaining stored data even when power supply is terminated. Examples of non-volatile memory device may include programmable read only memory (PROM), erasable PROM (EPROM), electrically EPROM (EEPROM), flash memory device, etc.

Recently, according to the technical demands for high integration and low power consumption characteristics and random access to memory cells, next-generation semiconductor memory devices such as magnetic random access memory (MRAM) and phase-change random access memory (PRAM) have been developed.

Such next generation semiconductor memory devices use variable resistance devices having resistance values that vary according to a current or a voltage applied thereto and are capable of maintaining the resistance values even when current or voltage supply is cut off. In order to realize high integration and low power consumption, it is desired that a resistance variation characteristic of a variable resistance device occur at a low application voltage, and a resistance variable range is increased.

SUMMARY

Provided are variable resistance memory devices.

Additional aspects will be set forth in part in the description which follows and, in part, will be apparent from the description, or may be learned by practice of the presented embodiments of the disclosure.

According to an embodiment, a variable resistance memory device includes a variable resistance layer including a first layer and a second layer on the first layer, the first layer including a first material and the second layer including a second material having a valence different from a valence of the first material, and a first conductive element and a second conductive element on the variable resistance layer and separated from each other so that an electric current path is formed in the variable resistance layer in a direction perpendicular to a direction in which the first layer and the second layer are stacked.

In some embodiments, a difference between the valence of the first material and the valence of the second material may be 1 or greater.

In some embodiments, a difference between a density of the first material and a density of the second material may be 1 g/cm$^3$ or greater.

In some embodiments, the variable resistance layer may further include a third layer on the second layer. The third layer may include a third material having a valence that is different from the valence of the second material.

In some embodiments, the first layer and the third layer may include a same material.

In some embodiments, the variable resistance layer may further include a fourth layer on the third layer, the fourth layer including a fourth material having a valence that is different from the valence of the third material.

In some embodiments, the first material may be the same as the third material.

In some embodiments, the second material may be the same as the fourth material.

In some embodiments, the first material and the second material independently each may include oxide materials having a band gap energy of 2 eV or greater.

In some embodiments, each of the first material and the second material independently may include one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, or $MnO_2$.

According to an embodiment, a variable resistance memory device includes a support layer including an insulating material; a variable resistance layer on the support layer, the variable resistance layer including a first layer and a second layer on the first layer, the first layer including a first material and the second layer including a second material having a valence different from a valence of the first material; a channel layer on the variable resistance layer; a gate insulating layer on the channel layer; and a plurality of gate electrodes on the gate insulating layer and separated from one another.

In some embodiments, a difference between the valence of the first material and the valence of the second material may be 1 or greater.

In some embodiments, a difference between a density of the first material and a density of the second material may be 1 g/cm$^3$ or greater.

In some embodiments, the variable resistance layer may further include a third layer on the second layer. The third layer may include a third material having a valence that is different from the valence of the second material.

The first layer and the third layer may include a same material.

In some embodiments, the variable resistance layer may further include a fourth layer on the third layer. The fourth layer may include a fourth material having a valence that is different from the valence of the third material.

In some embodiments, the first material may be the same as the third material.

In some embodiments, the second material may be the same as the fourth material.

In some embodiments, each of the first layer and the second layer may have a thickness of 10 nm or less.

In some embodiments, the first material and the second material may each include oxide materials having a band gap energy of 2 eV or greater.

Each of the first material and the second material may include one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, or $MnO_2$.

According to an embodiment, a variable resistance memory device includes a variable resistance layer including a plurality of layers sequentially on each other, the plurality of layers including a first layer and a second layer in contact with each other and having materials with different valences from each other, an interface between the first layer and the second layer including a plurality of oxygen vacancies; a first conductive element connected to a first region of the variable resistance layer; and a second conductive element connected to a second region of the variable resistance layer, the second conductive element being spaced apart from the first conductive element.

In some embodiments, each of a first material in the first layer and a second material in the second layer independently include one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

In some embodiments, the variable resistance memory device may further include a support layer including an insulating material; a channel layer on the support layer; a gate insulating layer on the channel layer; a plurality of gate electrodes on the gate insulating layer, the plurality of gate electrodes being separated from one another. The variable resistance layer may be between the support layer and the channel layer.

In some embodiments, each of the first layer and the second layer have a thickness of 10 nm or less.

In some embodiments, the first layer may include $Al_2O_3$ and the second layer may include $HfO_2$.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
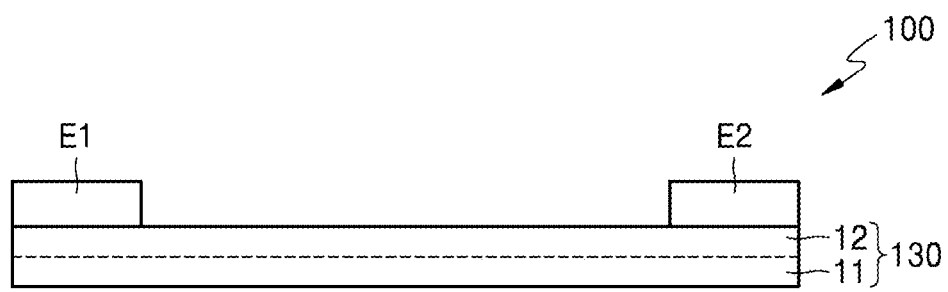
FIG. 1 is a cross-sectional view of a variable resistance memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

The disclosure will be described in detail below with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on the other layer or substrate, or intervening layers may also be present.

It will be understood that although the terms "first," "second," etc. may be used herein to describe various components, these components should not be limited by these terms. These components are only used to distinguish one component from another. The terms do not define that the components have different materials or structures from each other.

An expression used in the singular encompasses the expression of the plural, unless it has a clearly different meaning in the context. Throughout the specification, when a portion "includes" an element, another element may be further included, rather than excluding the existence of the other element, unless otherwise described.

In addition, the terms such as " . . . unit", "module", etc. provided herein indicates a unit performing at least one function or operation, and may be realized by hardware, software, or a combination of hardware and software.

As used herein, in particular, terms such as "the" and demonstratives similar thereto used herein may be to indicate both the singular and the plural.

Also, the steps of all methods described herein may be performed in any suitable order unless otherwise indicated herein or otherwise clearly contradicted by context. The use of any and all examples, or example language (e.g., "such as") provided herein, is intended merely to better illuminate the present disclosure and does not pose a limitation on the scope of the present disclosure unless otherwise claimed.

Figure 2:
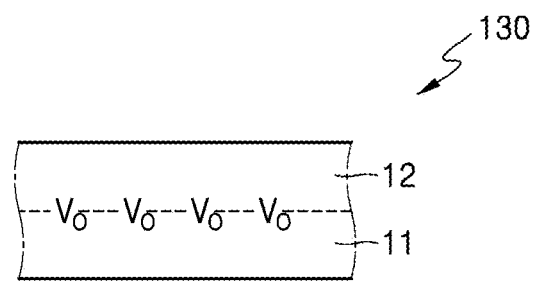
FIG. 2 is a conceptual diagram for illustrating a principle of a variable resistance in a variable resistance layer included in the variable resistance memory device of FIG. 1.

FIG. 1 is a cross-sectional view of a variable resistance memory device 100 according to an embodiment, and FIG. 2 is a conceptual diagram for illustrating a principle of resistance variation occurring in a variable resistance layer included in the variable resistance memory device of FIG. 1.

Referring to FIG. 1, the variable resistance memory device 100 includes a variable resistance layer 130 including a first layer 11 and a second layer 12, and a first conductive element E1 and a second conductive element E2 for applying a voltage to the variable resistance layer 130.

The variable resistance layer 130 includes the first layer 11 including a first material, and the second layer 12 on the first layer 11, the second layer 12 including a second material having a different valence from that of the first material. The first layer 11 may have a valence that is greater or less than that of the second layer 12.

The first conductive element E1 and the second conductive element E2 are at opposite ends on the variable resistance layer 130, and may be arranged to form a current path in the variable resistance layer 130 in a horizontal direction, that is, a direction perpendicular to a direction in which the first layer 11 and the second layer 12 are stacked, when a voltage is applied thereto. The first conductive element E1 and the second conductive element E2 may be formed in contact with opposite ends on the second layer 12. However, the disclosure is not limited to the above example, that is, the first and second conductive elements E1 and E2 may be formed in contact with opposite ends on the first layer 11.

The variable resistance layer 130 represents a resistance characteristic that varies depending on an applied voltage. The resistance characteristic of the variable resistance layer 130 is dependent upon whether a conductive filament is formed by behavior of oxygen in the variable resistance layer 130 according to the voltage applied to the first conductive element E1 and the second conductive element E2 on the variable resistance layer 130. According to whether the conductive filament is formed, the variable resistance layer 130 may represent a low-resistive state or a high-resistive state, and accordingly, information of '1' or '0' may be recorded. An applied voltage that changes the variable resistance layer 130 from a high resistive state to a low resistive state is referred to as a set voltage $V_{set}$ and an applied voltage that changes the variable resistance layer 130 from the low resistive state to the high resistive state is referred to as a reset voltage $V_{reset}$. The variable resistance memory device 100 according to the embodiment suggests the variable resistance layer 130 capable of implementing a low set voltage.

Figure 4:
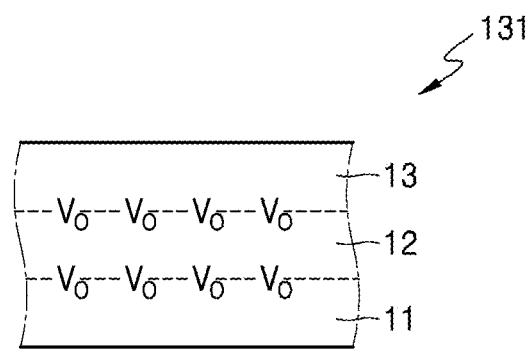
FIG. 4 is a conceptual diagram for illustrating a principle of a variable resistance in a variable resistance layer included in the variable resistance memory device of FIG. 3.

As in the embodiment, when the variable resistance layer 130 includes multiple layers, in which the first layer 11 and the second layer 12 including materials having different valences from each other are stacked adjacent to each other, as shown in FIG. 4, an oxygen vacancy $V_o$ is formed at an interface between the first and second layers 11 and 12 in order to balance charges.

For example, when a first material included in the first layer 11 is $HfO_2$ having a valence of 4 and a second material included in the second layer 12 is $Al_2O_3$ having a valence of 3, Al enters Hf site to form the oxygen vacancy at the interface between the first layer 11 and the second layer 12. The above atom behavior may be expressed by a formula below.

$$Al_2O_3 + HfO_2 \rightarrow 2Al_{Hf}' + V_O^{\cdot\cdot} + 3O_O^x$$

In the formula above, $Al_{Hf}'$ denotes a structure in which some Al occupies Hf site in $HfO_2$ in the structure of $Al_2O_3$. $V_O^{\cdot\cdot}$ denotes a structure in which O site is empty and $O_O^x$ denotes a structure in which O is located in O site.

The oxygen vacancies $V_o$ formed as above are collected to form the conductive filament, and the resistance of the variable resistance layer 130 is lowered by the conductive filament.

When the conductive filament is sufficiently formed even at a low applied voltage and a difference between resistances in the low resistive state and the high resistive state generated by the applied voltage is increased, the variable resistance performance is excellent. To this end, the variable resistance layer 130 includes a structure in which oxide materials having different valences are arranged adjacent to each other, and a difference between the valences of the first layer 11 and the second layer 12 may be 1 or greater such that the oxygen vacancies $V_o$ may be sufficiently formed.

When the variable resistance layer 130 is configured as in the embodiment, a desired range of resistance variation may be implemented with a less thickness as compared with a variable resistance device based on charge-trapping or a variable resistance device using a phase change material. The first layer 11 and the second layer 12 in the variable resistance layer 130 may each have a thickness, for example, of about 10 nm or less.

The first material and the second material included in the variable resistance layer 130 may include various oxide materials. For example, the first material and the second material may include an oxide material of at least one atom selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), proseodymium (Pr), rubidium (Rb), barium (Ba), magnesium (Mg), beryllium (Be), niobium (Nb), vanadium (V), gadolunium (Gd), scandium (Sc), and silicon (Si). The first material and the second material may each include an oxide material having a band gap energy of 2 eV or greater, for example, one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, $MnO_2$.

Valences of the above materials are shown in Table 1 below.

TABLE 1

| Composition | Valence |
|---|---|
| $Rb_2O$ | +1 |
| $TiO_2$ | +4 |
| $BaO$ | +2 |
| $ZrO_2$ | +4 |
| $HfO_2$ | +4 |
| $CaO$ | +2 |
| $SrO$ | +2 |
| $Sc_2O_3$ | +3 |
| $MgO$ | +2 |
| $Al_2O_3$ | +3 |
| $SiO_2$ | +4 |
| $BeO$ | +2 |
| $Nb_2O_5$ | +5 |
| $NiO$ | +2 |
| $Ta_2O_5$ | +5 |
| $WO_3$ | +6 |
| $V_2O_5$ | +5 |
| $La_2O_3$ | +3 |
| $Gd_2O_3$ | +3 |
| $CuO$ | +2 |
| $MoO_3$ | +6 |
| $Cr_2O_3$ | +3 |
| $MnO_2$ | +4 |

Referring to Table 1 above, two materials having different valences may be selected and applied to the first layer 11 and the second layer 12. A difference between the valences of the first layer 11 and the second layer 12 may be set so that replacement between atoms easily occurs due to the difference in the valences and oxygen vacancies may be sufficiently formed. For example, materials used in the first layer 11 and the second layer 12 may be selected so that the difference between valences of the first layer 11 and the second layer 12 may be 1 or greater. For example, the first layer 11 may include $HfO_2$ having a valence of 4, and the second layer 12 may include $Al_2O_3$ having a valence of 3. In addition, following combinations may be used.

TABLE 2

| first material (second material) | second material (first material) |
|---|---|
| $Al_2O_3$ | $TiO_2$ |
| $Al_2O_3$ | $HfO_2$ |
| $Al_2O_3$ | $ZrO_2$ |
| $Al_2O_3$ | $SiO_2$ |
| SrO | $Al_2O_3$ |
| SrO | $La_2O_3$ |
| NiO | $Gd_2O_3$ |
| NiO | $Al_2O_3$ |
| $Rb_2O$ | CaO |
| $Rb_2O$ | MgO |

As illustrated in the combinations above, the first material and the second material may be selected from among materials having a valence difference of 1. However, one or more embodiments are not limited thereto, and other combinations having a valence difference of 2 or greater may be selected.

Even when the valence difference between the first material and the second material is constant, the oxygen vacancies may be sufficiently formed as a density difference between the first material and the second material increases. Since the oxide having a low density has a larger space between atoms than that of the oxide having a high density, diffusion of oxygen ions ($O^{2-}$) may occur sufficiently towards the oxide having the low density. In this regard, the first material and the second material may be selected so that the difference between densities of the first layer 11 and the second layer 12 is, for example, 1 g/cm$^3$ or greater. Among the combinations in Table 1 above, a combination of $Al_2O_3$/$HfO_2$ has the largest density difference between two materials, and it may be estimated that the oxygen vacancies may be sufficiently formed. However, one or more embodiments are not limited to the above combination.

Figure 3:
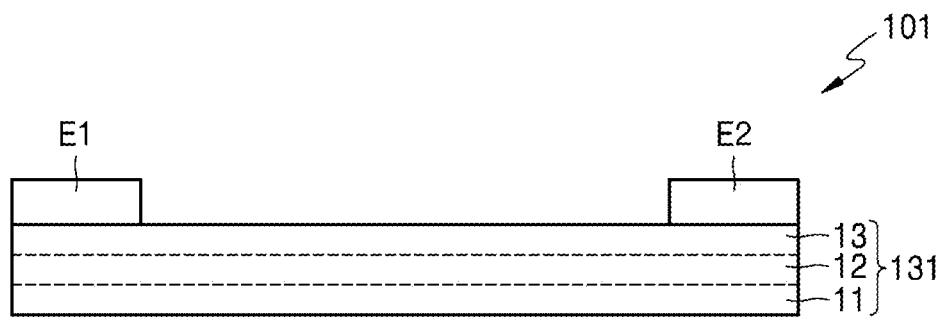
FIG. 3 is a cross-sectional view of a variable resistance memory device according to another embodiment.

FIG. 3 is a cross-sectional view of a variable resistance memory device 101 according to another embodiment. FIG. 4 is a conceptual diagram for illustrating a principle of a variable resistance in a variable resistance layer included in the variable resistance memory device of FIG. 3.

A variable resistance layer 131 of the variable resistance memory device 101 includes the first layer 11, the second layer 12, and a third layer 13, and the first conductive element E1 and the second conductive element E2 may be arranged in contact with opposite ends on the third layer 13.

The variable resistance layer 131 has a structure in which two or more materials having different valences are stacked, and two adjacent layers from among the first to third layers 11, 12, and 13 may have materials having different valences from each other. That is, a first material in the first layer 11 and a second material in the second layer 12 may have different valences, and the second material in the second layer 12 and a third material in the third layer 13 may have different valences. The first material and the third material may be the same as or different from each other.

A difference between the valences of the first material in the first layer 11 and the second material in the second layer 12 may be 1 or greater. A difference between the valences of the second material in the second layer 12 and the third material in the third layer 13 may be 1 or greater.

The second material in the second layer 12 that is an intermediate layer in the variable resistance layer 131 is not particularly restricted, provided that the valence thereof is different from those of the first and third materials. For example, the valences of the first layer 11, the second layer 12, and the third layer 13 may be in an increasing or decreasing order, or the valence of the second material in the second layer 12 may be the greatest or the smallest.

Each of the first to third materials may be selected such that the oxygen vacancies that generate at interfaces among the first to third layers 11, 12, and 13 due to the valence difference may be sufficiently generated. The first layer 11 and the third layer 13 may include $HfO_2$ and the second layer may include $Al_2O_3$. The first layer 11 and the third layer 13 may include the first material, and the second layer 12 may include the second material. For example, combinations of the first and second materials as illustrated in Table 2 above may be selected. Also, materials having a density difference of 1 g/cm$^3$ or greater may be selected as the first and second materials, or materials having a density difference of 1 g/cm$^3$ or greater from among the combinations having different valences may be selected as the first and second materials.

The first to third layers 11, 12, and 13 may each have a thickness of 10 nm or less. The second layer 12 may have the smallest thickness, for example, a thickness of 2 nm or less.

In the embodiment, the variable resistance layer 131 is configured to have a triple-layered structure, in which materials having difference valences are adjacent to each other, and thus, the interfaces where the oxygen vacancies caused by the difference in the valences are generated may be increased. As shown in FIG. 4, when the oxygen vacancies $V_o$ and interstitial oxygen ions $O^{2-}$ are formed in the variable resistance layer 131 due to the application of voltage, replacement of atoms may occur at the interface between the two materials having different valences, that is, an interface between the first and second layers 11 and 12 and an interface between the second and third layers 12 and 13, and thus, the oxygen vacancies $V_o$ are sufficiently formed and the conductive filament caused by the oxygen vacancies $V_o$ may be easily generated. For example, the conductive filament may be more sufficiently formed than the structure shown in FIG. 1.

Figure 5:
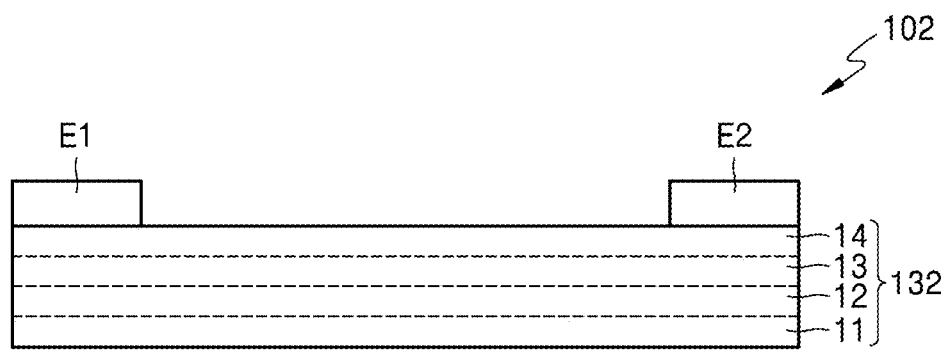
FIG. 5 is a cross-sectional view of a variable resistance memory device according to another embodiment.

FIG. 5 is a cross-sectional view of a variable resistance memory device 102 according to another embodiment.

In the variable resistance memory device 102 according to the embodiment, a variable resistance layer 132 includes the first layer 11, the second layer 12, the third layer 13, and a fourth layer 14.

Two or more materials from among a first material, a second material, a third material, and a fourth material respectively included in the first to fourth layers 11, 12, 13, and 14 may have different valences from each other. Also, adjacent layers may have materials having different valences from each other. That is, the first material and the second material have different valences, the second material and the third material have different valences, and the third material and the fourth material have different valences. The first material may be the same as the third material. The second material may be the same as the fourth material. For example, the first and third layers 11 and 13 may include the first material, and the second and fourth layers 12 and 14 may include the second material. Combinations of the first and second materials as illustrated in Table 2 above may be selected. Also, materials having a density difference of 1 g/cm³ or greater may be selected as the first and second materials, or materials having a density difference of 1 g/cm³ or greater from among the combinations having different valences may be selected as the first and second materials. However, one or more embodiments are not limited to the above example.

The materials included in the first to fourth layers 11, 12, 13, and 14 of the variable resistance layer 132 are not particularly restricted provided that materials in the adjacent layers have different valences from each other. For example, the valences of the first to fourth layers 11, 12, 13, and 14 may be in an increasing or decreasing order, or the second layer 12 or the third layer 13 may include a material having the greatest or the smallest valence.

The first to fourth materials may be set such that the difference between valences of the adjacent layers is 1 or greater, and such that the oxygen vacancies generated due to the difference between the valences at the interfaces may be sufficiently generated.

Various oxides each having a band gap energy of 2 eV or greater may be included in each of the first to fourth layers 11, 12, 13, and 14, and as described above, may be selected such that the difference between the valences at the interface between the adjacent layers is as large as possible.

Due to the setting of the materials, the difference between the valences may be as large as possible at the interfaces among the plurality of layers, and the oxygen vacancies caused by the replacement among atoms may be easily formed.

The variable resistance layer 132 has a structure in which the interface between the materials having different valences is further added. In addition, since the interfaces where the conductive filaments are formed by the oxygen vacancies increase, the variable resistance range may be also increased.

Figure 6:
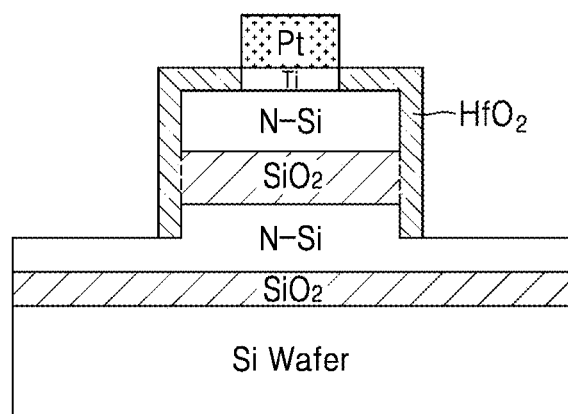
FIGS. 6 and 7 are cross-sectional views of a sample to test a variable resistance characteristic of a configuration in which variable resistance materials having difference valences are adjacently stacked.
Figure 7:
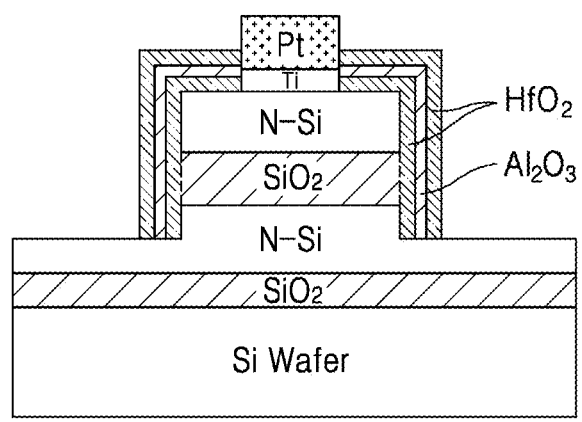

FIGS. 6 and 7 are cross-sectional views of a sample that is produced to test a variable resistance performance with respect to a configuration in which variable resistance materials having difference valences are adjacently stacked.

As shown in FIG. 6, a SiO₂ having a thickness of 100 nm, an N-type Si layer having a thickness of 400 nm, a SiO₂ layer having a thickness of 10 nm, and an N-type Si layer having a thickness of 50 nm are sequentially stacked on a Si wafer, and then a patterning process and an etching process are performed to form a cylindrical device having N—Si (50 nm)/SiO₂ (10 nm)/N—Si (400 nm) structure. A variable resistance material, e.g., HfO₂ is deposited to 10 nm on a side surface of the cylindrical device, and then, when a voltage is applied between an upper electrode, e.g., N—Si, and a lower electrode, e.g., N—Si, an electric current flows from the upper N—Si to the lower N—Si along a HfO₂/SiO₂ layer. Here, Ti (10 nm)/Pt (40 nm) are deposited on the upper electrode, e.g., N—Si, in order to improve a contact resistance between the upper electrode, e.g., N—Si, and a probe station terminal.

FIG. 7 shows a structure, in which the HfO₂ layer of the structure of FIG. 6 is formed to a thickness of 2 nm, and additionally, Al₂O₃ is deposited to 2 nm and HfO₂ is deposited to 2 nm on the HfO₂ layer. When the voltage is applied between the upper electrode, e.g., N—Si, and the lower electrode, e.g., N—Si, the electric current flows from the upper N—Si to the lower N—Si along the SiO₂/HfO₂/Al₂O₃ layers.

The structures of FIGS. 6 and 7 are provided to simulate the variable resistance performance of a multi-layered structure, in which materials having different valences are adjacent to one another.

In the above two structures, a set voltage $V_{set}$ by which the high-resistive state is changed to the low-resistive state was measured, and in 35 samples having the structure of FIG. 6, an average set voltage $V_{set}$ was measured as 12.36 V, and in 56 samples having the structure of FIG. 7, an average set voltage $V_{set}$ was measured as 6.85 V.

When being compared with a set voltage $V_{set}$ that is generally shown to be 15 or greater in a variable resistance device using a charge trap layer according to the related art, it is recognized that there is an effect of reducing the set voltage in a structure in which two layers having different valences are arranged adjacent to each other.

In the above embodiments, the variable resistance layers 130, 131, and 132 have the double-layered, triple-layered, and quadruple-layered structures, but one or more embodiments are not limited thereto, that is, a structure including five or more layers, to which an interface where the valences are different is added, may be used.

Figure 8:
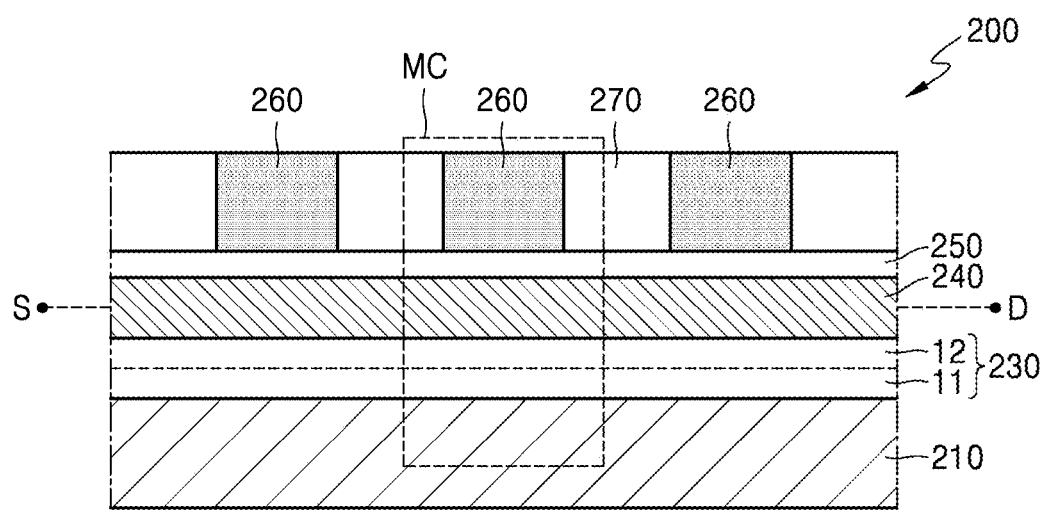
FIG. 8 is a cross-sectional view of a variable resistance memory device according to another embodiment.
Figure 9:
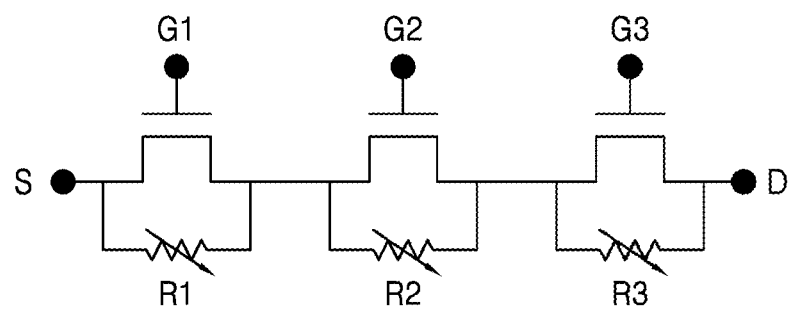
FIG. 9 is an equivalent circuit diagram of the variable resistance memory device of FIG. 8.
Figure 10:
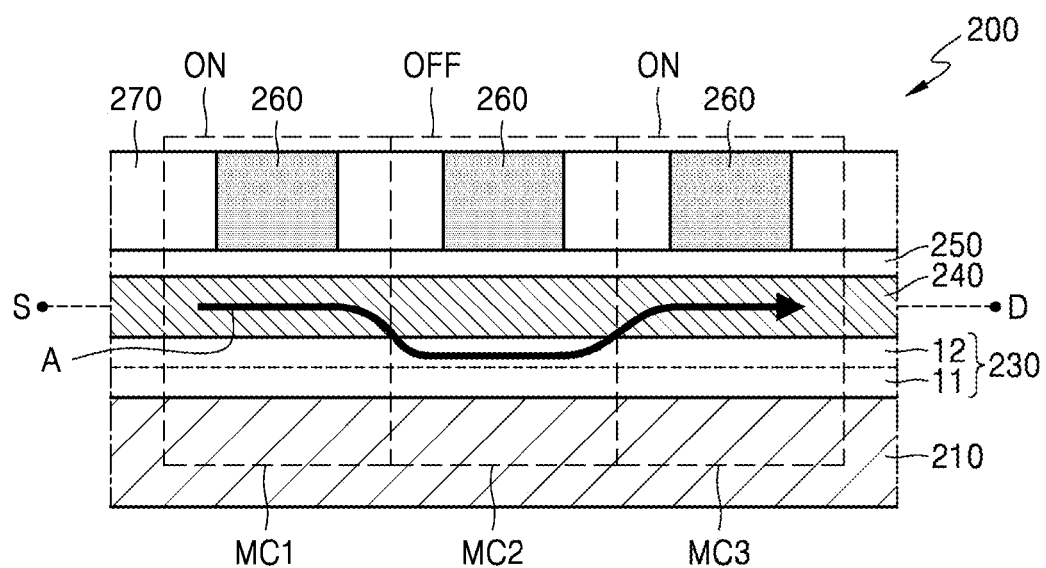
FIG. 10 is a conceptual diagram for illustrating example operations of the variable resistance memory device of FIG. 8.

FIG. 8 is a cross-sectional view of a variable resistance memory device 200 according to another embodiment, and FIG. 9 is an equivalent circuit diagram of the variable resistance memory device 200 of FIG. 8. FIG. 10 is a conceptual diagram for illustrating example operations of the variable resistance memory device 200 of FIG. 8.

Referring to FIG. 8, the variable resistance memory device 200 includes an insulating layer 210, a variable resistance layer 230 on the insulating layer 210, a channel layer 240 on the variable resistance layer 230, a gate insulating layer 250 on the channel layer 240, and a plurality of gate electrodes 260 on the gate insulating layer 250. Spaces among the plurality of gate electrodes 260 may be filled with an insulating layer 270. However, one or more embodiments are not limited thereto, that is, the insulating layer 270 may be omitted.

The variable resistance layer 230 includes the first layer 11 including a first material and the second layer 12 including a second material having a valence that is different from that of the first material. The second layer 12 may have a greater valence than that of the first layer 11. Materials in the variable resistance layer 230 and characteristics of the variable resistance layer 230 are substantially the same as the above descriptions about the variable resistance layer 130 with reference to FIG. 1. When materials having different valences are mixed, the replacement among atoms occurs and the oxygen vacancies are generated. Accordingly, the oxygen vacancies $V_o$ are actively generated at the interface between the first layer 11 and the second layer 12, and thus, the conductive filaments may be easily formed.

Although it is shown that the second layer 12 having the greater valence is on the first layer 11 having the less valence in the variable resistance layer 230, one or more embodiments are not limited thereto, that is, a stacking order of the first layer 11 and the second layer 12 may be changed. That is, the first layer 11 having the less valence may be formed on the second layer 12 having the greater valence, and the first layer 11 may be in contact with the channel layer 240.

The channel layer 240 may include a semiconductor material. The channel layer 240 may include, for example, poly-Si. A source electrode S and a drain electrode D may be connected to opposite ends of the channel layer 240.

The gate insulating layer 250 may include various kinds of insulating materials. For example, the gate insulating layer 250 may include silicon oxide, silicon nitride, or silicon oxynitride.

A voltage for turning on/turning off the channel layer 240 may be selectively applied to each of the plurality of gate electrodes 260.

The variable resistance memory device 200 has a structure including an array of a plurality of memory cells MC, and each of the memory cells MC may have a structure in which a transistor and a variable resistor are connected in parallel as shown in the equivalent circuit diagram of FIG. 9. Respective variable resistance may be set by the voltage applied to each gate electrode and the voltage between the source electrode S and the drain electrode D, and may have a value corresponding to information 1 or 0.

Operations of the variable resistance memory device 200 will be described below with reference to FIG. 10.

When a memory cell to be recorded is selected, a gate voltage value of the corresponding memory cell is adjusted so as not to form a channel, that is, so that the channel is turned off, and gate voltage values of unselected memory cells are adjusted so that channels in the unselected memory cells are turned on.

FIG. 10 shows an example, in which a gate voltage is applied to the gate electrode 260 in each memory cell so that a memory cell MC2 at a center is turned off (OFF) and two memory cells MC1 and MC3 at opposite sides of the memory cell MC2 are turned on (ON). When the voltage is applied between the source electrode S and the drain electrode D, a conductive path denoted by the arrow A is formed. Desired information of 1 or 0 may be recorded on the selected memory cell MC2 by applying a voltage having a value of the set voltage $V_{set}$ or the reset voltage $V_{reset}$.

In a reading operation, reading of the selected memory cell may be performed similarly as above. That is, a gate voltage applied to each of the gate electrodes 260 is adjusted so that the channel of the selected memory cell MC2 is turned off and the channels of the unselected memory cells MC1 and MC3 are turned on, and after that, an electric current flowing in the corresponding memory cell MC2 due to an applied voltage $V_{read}$ between the source electrode S and the drain electrode D is measured to identify the memory cell state (1 or 0).

Figure 11:
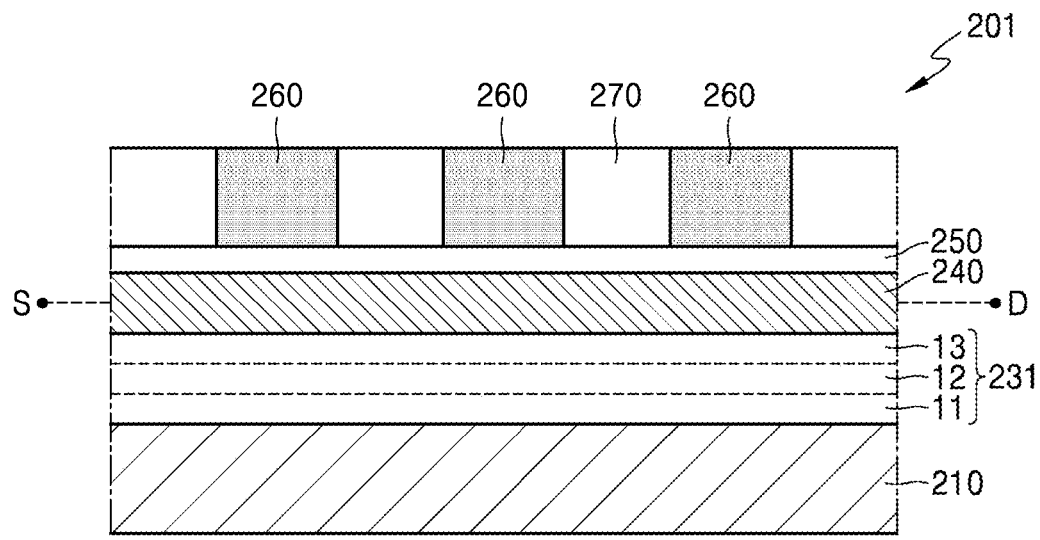
FIG. 11 is a cross-sectional view of a variable resistance memory device according to another embodiment.

FIG. 11 is a cross-sectional view of a variable resistance memory device 201 according to another embodiment.

The variable resistance memory device 201 of the embodiment is different from the variable resistance memory device 200 shown in FIG. 8 in that a variable resistance layer 231 includes the first layer 11, the second layer 12, and the third layer 13, and the other components of the variable resistance memory device 201 are substantially the same as those of the variable resistance memory device 200 shown in FIG. 8.

The variable resistance layer 231 includes the first to third layers 11, 12, and 13. The second layer 12 at the center of the variable resistance layer 231 may include a material having the higher valence than those of the first and third layers 11 and 13. Alternatively, the second layer 12 may include a material having lower valence than those of the first and third layers 11 and 13. The first layer 11 and the third layer 13 may include the same material. However, one or more embodiments are not limited thereto, that is, the first layer 11 and the third layer 13 may include different materials from each other.

The variable resistance layer 231 of the variable resistance memory device 201 according to the embodiment sets the materials included in the first layer 11, the second layer 12, and the third layer 13, so that a plurality of interfaces among the materials having different valences are generated and the valence difference at each interface may be as large as possible, like in the variable resistance layer 131 of FIG. 3. First to third materials may be selected so that the second material in the second layer 12 at the center of the variable resistance layer 231 may be the smallest or the greatest. Accordingly, the replacement among atoms may be actively generated, and then, the oxygen vacancies may be easily generated and the conductive filament may be easily formed. The variable resistance memory device 201 according to the embodiment may have a low set voltage, for example, a set voltage less than that of the variable resistance memory device 200 of FIG. 8.

Figure 12:
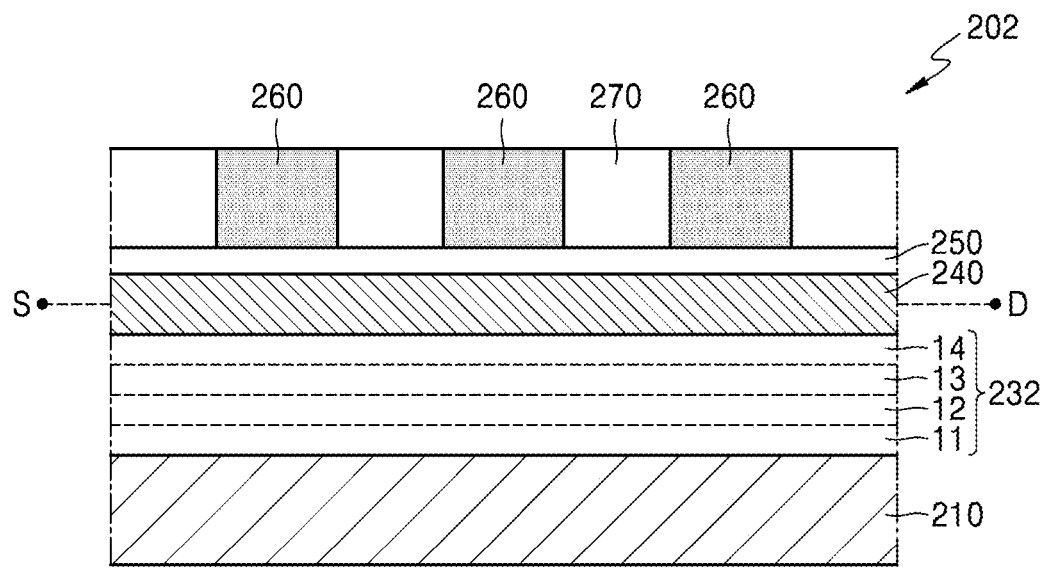
FIG. 12 is a cross-sectional view of a variable resistance memory device according to another embodiment.

FIG. 12 is a cross-sectional view of a variable resistance memory device 202 according to another embodiment.

The variable resistance memory device 202 of the embodiment has the substantially same structure as that of the variable resistance memory device 201 of FIG. 11, except that a variable resistance layer 232 has a quadruple-layered structure including the first layer 11, the second layer, the third layer 13, and the fourth layer 14.

Two or more materials from among a first material, a second material, a third material, and a fourth material respectively included in the first to fourth layers 11, 12, 13, and 14 may have different valences from each other. Also, adjacent layers may have materials having different valences from each other. That is, the first material and the second material have different valences, the second material and the third material have different valences, and the third material and the fourth material have different valences. The first material may be the same as the third material. The second material may be the same as the fourth material.

The variable resistance layer 232 of the variable resistance memory device 202 according to the embodiment sets the materials included in the first layer 11, the second layer 12, the third layer 13, and the fourth layer 14, so that a plurality of interfaces among the materials having different valences are generated and the valence difference at each interface may be as large as possible, like in the variable resistance layer 132 of FIG. 5.

Due to the setting of the materials, the difference between the valences may be as large as possible at the interfaces among the plurality of layers, and the oxygen vacancies caused by the replacement among atoms may be sufficiently formed.

The variable resistance layer 232 has a structure in which the interface between the materials having different valences is further added. In addition, since the interfaces where the conductive filaments are formed by the oxygen vacancies increase, the variable resistance range may be also increased.

Figure 13:
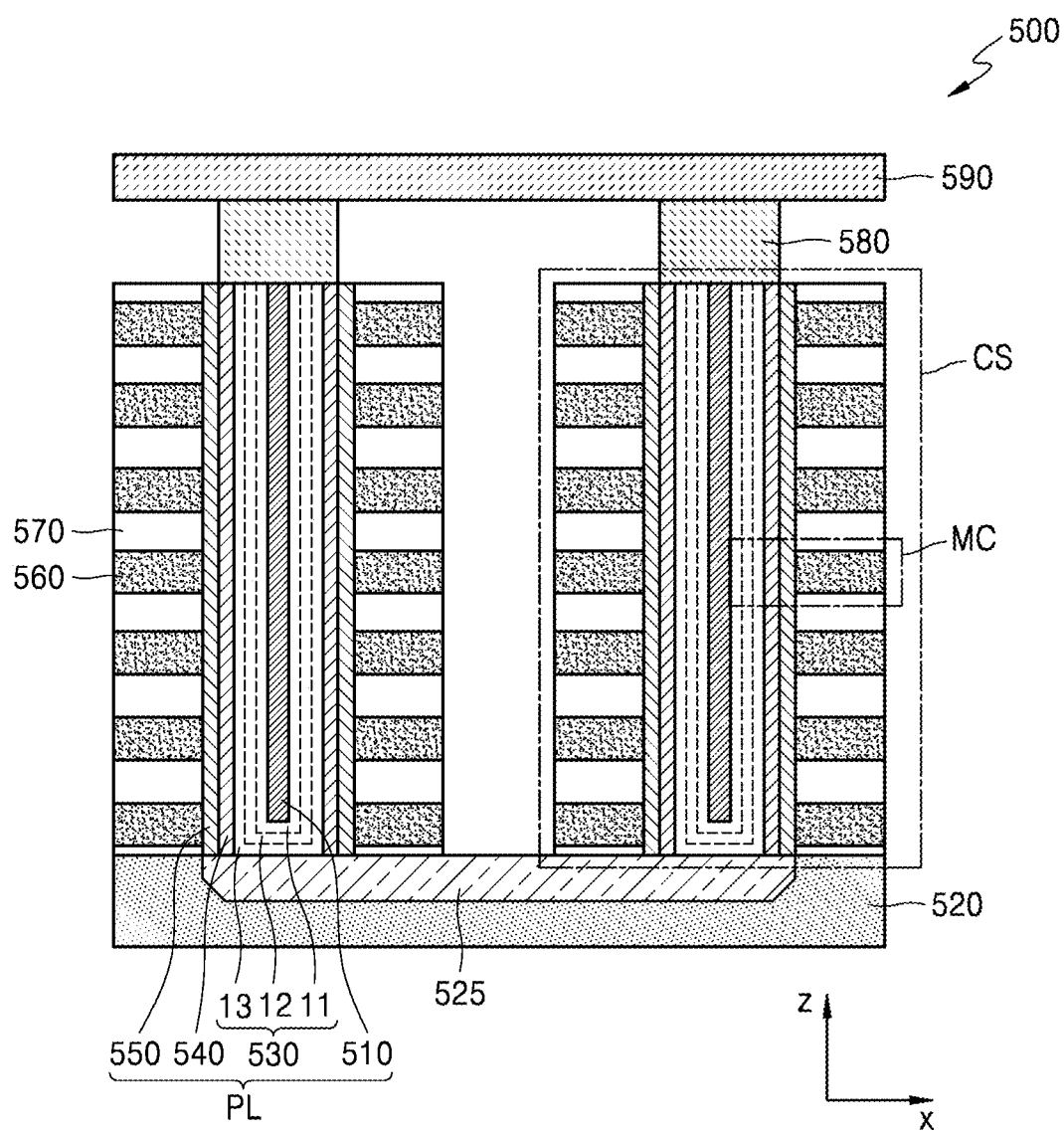
FIG. 13 is a cross-sectional view of a variable resistance memory device according to another embodiment.
Figure 14:
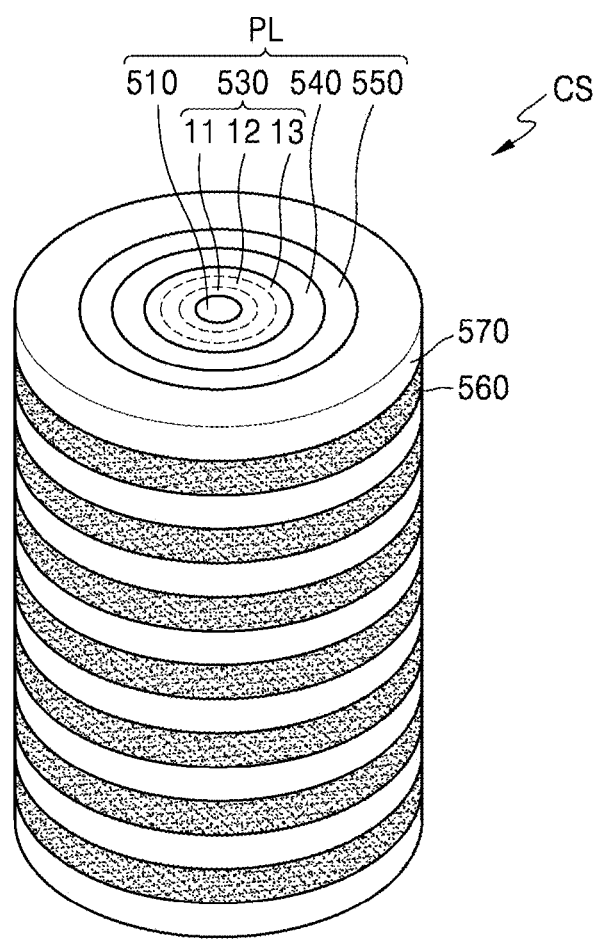
FIG. 14 is a perspective view of a memory string included in the variable resistance memory device of FIG. 13.
Figure 15:
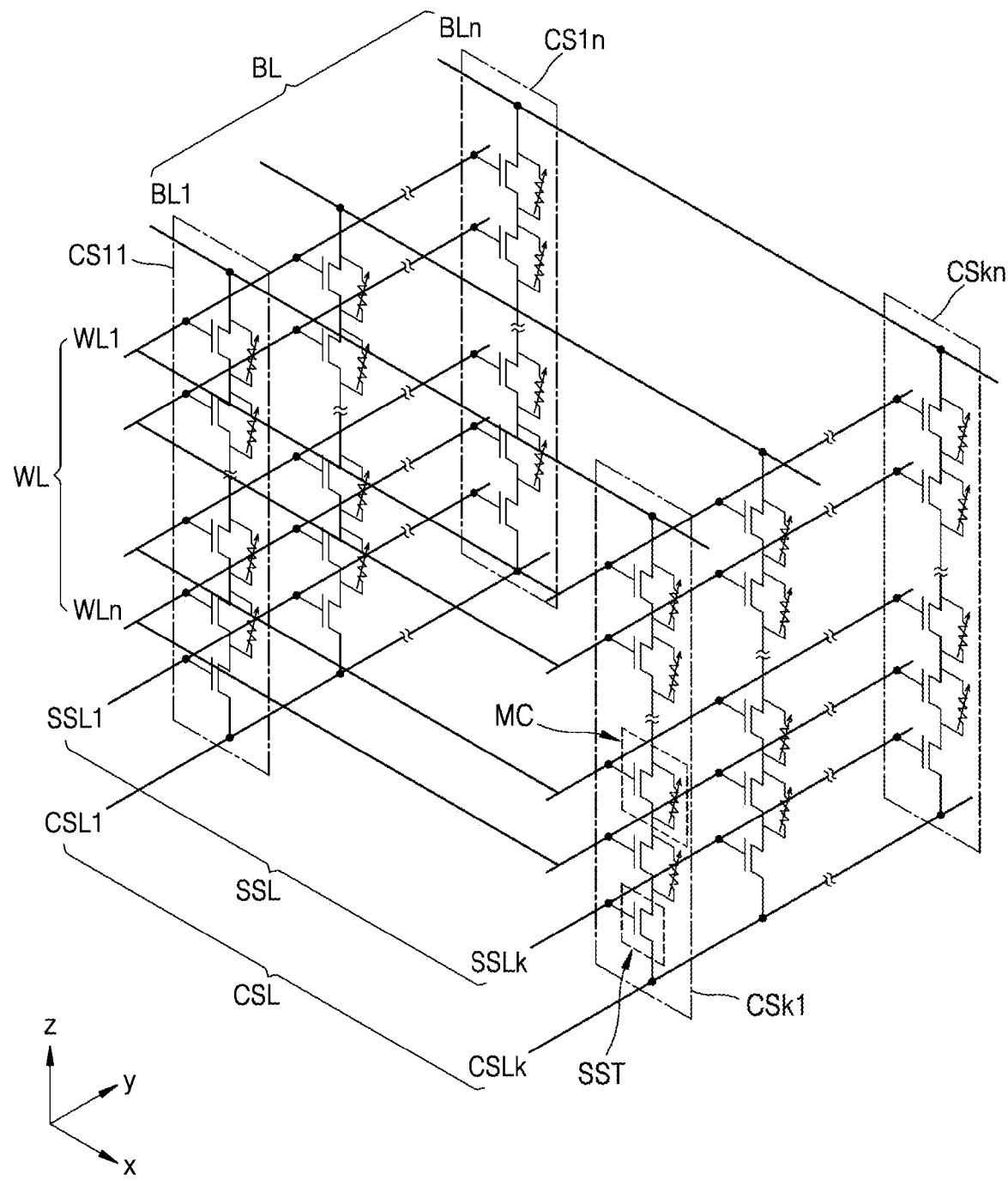
FIG. 15 is an equivalent circuit diagram of the variable resistance memory device of FIG. 13.

FIG. 13 is a cross-sectional view of a variable resistance memory device 500 according to another embodiment, and FIG. 14 is a perspective view of a memory string included in the variable resistance memory device 500 of FIG. 13. FIG. 15 is an equivalent circuit diagram of the variable resistance memory device 500 of FIG. 13.

The variable resistance memory device 500 according to the embodiment includes a vertical NAND (VNAND) memory in which a plurality of memory cells MC each including a variable resistance material are arrayed in a vertical direction.

Referring to FIGS. 13 to 15, detailed structure of the variable resistance memory device 500 will be described below.

Referring to FIG. 13, a plurality of cell strings CS are formed on a substrate 520.

The substrate 520 may include a silicon material doped with first type impurities. For example, the substrate 520 may include a silicon material doped with p-type impurities. For example, the substrate 520 may include a p-type well (e.g., a pocket p-well). Hereinafter, it will be assumed that the substrate 520 includes p-type silicon. However, the substrate 520 is not limited to the p-type silicon.

A doping region 525 is provided in the substrate 520. For example, the doping region 525 may be of a second type that is different from that of the substrate 520. For example, the doping region 525 may be of an n-type. Hereinafter, it will be assumed that the doping region 525 is of the n-type. However, the doping region 525 is not limited to the n-type. The doping region 525 may be a common source line CSL.

There may be k*n cell strings CS that are arranged in a matrix as shown in the circuit diagram of FIG. 15, and may each be named as CSij (1≤i≤k, 1≤j≤n) according to a location thereof in each row and column. Each of the cell strings CSij is connected to a bit line BL, a string selection line SSL, a word line WL, and the common source line CSL.

Each of the cell strings CSij includes memory cells MC and a string selection transistor SST. The memory cells MC and the string selection transistors SST in each of the cell strings CSij may be stacked in a height direction.

The plurality of rows of the cell strings CSij are respectively connected to different string selection lines SSL1 to SSLk. For example, the string selection transistors SST in cell strings CS11 to CS1n are commonly connected to a string selection line SSL1. The string selection transistors SST in the cell strings CSk1 to CSkn are commonly connected to the string selection line SSLk.

The plurality of columns of the cell strings CS are respectively connected to different bit lines BL1 to BLn. For example, the memory cells MC and the string selection transistors SST in the cell strings CS11 to CSk1 may be commonly connected to the bit line BL1, and the memory cells MC and the string selection transistors SST in the cell strings CS1n to CSkn may be commonly connected to the bit line BLn.

The plurality of rows of the cell strings CS may be respectively connected to different common source lines CSL1 to CSLk. For example, the string selection transistors SST in the cell strings CS11 to CS1n may be commonly connected to the common source line CSL1 and the string selection transistors SST of the cell strings CSk1 to CSkn may be commonly connected to the common source line CSLk.

The memory cells MC at the same height from the substrate 520 (or the string selection transistors SST) are commonly connected to one word line WL and the memory cells MC at different heights from the substrate 520 (or the string selection transistors SST) may be respectively connected to different word lines WL1 to WLm.

The circuit structure shown in FIG. 15 is an example. For example, the number of rows of the cell strings CS may be increased or decreased. As the number of rows of the cell strings CS varies, the number of string selection lines connected to the rows of the cell strings CS and the number of cell strings CS connected to one bit line may also vary. As the number of rows of the cell strings CS varies, the number of common source lines connected to the rows of the cell strings CS may also vary.

The number of columns of the cell strings CS may be increased or decreased. As the number of columns of the cell strings CS varies, the number of bit lines connected to the columns of the cell strings CS and the number of cell strings CS connected to one string selection line may also vary.

The height of the cell strings CS may increase or decrease. For example, the number of memory cells MC stacked in each of the cell strings CS may increase or decrease. As the number of memory cells MC stacked in each of the cell strings CS varies, the number of word lines WL may also vary. For example, the number of string selection transistors provided to each of the cell strings CS may increase. As the number of string selection transistors provided to each of the cell strings CS varies, the number of the string selection lines or the common source lines may also vary. As the number of string selection transistors increases, the string selection transistors may be stacked like the memory cells MC.

For example, writing and reading operations may be performed in units of rows of the cell strings CS. The cell strings CS are selected by the common source lines CSL in units of one row and may be selected by the string selection lines SSL in units of one row. Also, the voltage may be applied to the common source lines CSL in units of at least two common source lines CSL. The voltage may be applied to the common source lines CSL in units of total common source lines CSL.

In a selected row of the cell strings CS, the writing and reading operations may be performed in units of pages. A page may denote one row of memory cells MC connected to one word line WL. In the selected row of the cell strings CS, the memory cells MC may be selected by the word lines WL in units of pages.

The cell string CS may include a cylindrical pillar PL and a plurality of gates 560 and a plurality of insulators 570 which surround the cylindrical pillar PL in a ring shape, as shown in FIG. 13. That is, the plurality of gates 560 and the plurality of insulators 570 may be stacked alternately with each other along a vertical direction (Z-direction).

Each of the gates 560 may include a metal material or a silicon material doped at a high concentration. Each of the gates 560 is connected to one of the word line WL and the string selection line SSL.

Each of the insulators 570 may include one or more of various insulating materials, e.g., silicon oxide, silicon nitride, etc.

The pillar PL may include a plurality of layers. An outermost layer of the pillar PL may include a gate insulating layer 550. For example, the gate insulating layer 550 may include various insulating materials, e.g., one or more of silicon oxide, silicon nitride, silicon oxynitride, etc. The gate insulating layer 550 may be conformally deposited on the pillar PL.

A channel layer 540 may be conformally deposited on an internal surface of the gate insulating layer 550. The channel layer 540 may include a semiconductor material doped with the first type impurities. The channel layer 540 may include a silicon material doped with the same type as that of the substrate 520. For example, when the substrate 520 includes the silicon material doped with p-type impurities, the channel layer 540 may also include the silicon material doped with the p-type impurities. Alternatively, the channel layer 540 may include a material such as Ge, IGZO, GaAs, etc.

A variable resistance layer 530 may be arranged along the internal surface of the channel layer 540. The variable resistance layer 530 may be arranged to be in contact with the channel layer 540, and may be conformally deposited on the channel layer 540.

The variable resistance layer 530 changes into a high-resistive state or a low-resistive state according to a voltage applied thereto, and may include the first layer 11, the second layer 12, and the third layer 13 which include oxide materials having different valences from one another.

The first layer 11, the second layer 12, and the third layer 13 of the variable resistance layer 530 may each include an oxide material of at least one atom selected from the group consisting of Zr, Hf, Al, Ni, Cu, Mo, Ta, Ti, W, Cr, Sr, La, Mn, Ca, Pr, and Si. The first to third layers 11, 12, and 13 may each include an oxide material having a band gap energy of 2 eV or greater, for example, one of $Rb_2O$, $TiO_2$, BaO, $ZrO_2$, CaO, $HfO_2$, SrO, $Sc_2O_3$, MgO, $Li_2O$, $Al_2O_3$, $SiO_2$, and BeO.

The variable resistance layer 530 has a structure in which two or more materials having different valences are stacked, and two adjacent layers from among the first to third layers 11, 12, and 13 may have materials having different valences from each other. As described above with reference to the variable resistance layer 131 of FIG. 3 and the variable resistance layer 231 of FIG. 11, the variable resistance layer 350 may set a first material in the first layer 11, a second material in the second layer 12, and a third material in the third layer 13, so that the oxygen vacancies may be sufficiently generated due to the replacement among atoms at each interface. Accordingly, the variable resistance memory device 500 may have characteristics of low set voltage and low reset voltage.

Although the variable resistance layer 530 has a triple-layered structure as an example, one or more embodiments are not limited thereto, that is, the variable resistance layer may include two or more layers in which layers having different valences are arranged adjacent to each other. For example, in some embodiments, the variable resistance layer 530 may have a double-layer structure with only the first layer 11 and the second layer 12. Alternatively, in other embodiments, the variable resistance layer 530 may have four or more layers, such as further including the fourth layer 14 surrounding the third layer 13.

The channel layer 540 and the variable resistance layer 530 may be in contact with the doping region 525, that is, the common source region.

A drain 580 may be provided on the pillar PL. The drain 580 may include a silicon material doped as the second type. For example, the drain 580 may include the silicon material doped as n-type.

A bit line 590 may be provided on the drain 580. The drain 580 and the bit line 590 may be connected to each other via contact plugs.

Each of the gates 560 and regions in the gate insulating layer 550, the channel layer 540, and the variable resistance layer 530, the regions facing each gate 560 in a horizontal direction (X-direction), configure the memory cell MC. That is, the memory cell MC has a circuit structure, in which the transistor including the gate 560, the gate insulating layer 550, and the channel layer 540 and a variable resistor provided by the variable resistance layer 530 are connected in parallel.

The above parallel connection structure is continuously arranged in the vertical direction (Z-direction) to form the cell string CS. In addition, opposite ends of the cell string CS may be connected to the common source line CSL and the bit line BL as shown in the circuit diagram of FIG. 15. When the voltage is applied to the common source line CSL and the bit line BL, the programming, reading, and erasing operations may be performed on the plurality of memory cells MC.

For example, when a memory cell MC to be recorded on is selected, a gate voltage value of the corresponding memory cell is adjusted so as not to form a channel, that is, so that the channel is turned off, and gate voltage values of unselected memory cells are adjusted so that channels in the unselected memory cells are turned on. Accordingly, the current path formed by the voltage applied to the common source line CSL and the bit line BL passes through the region of the variable resistance layer 530 in the selected memory cell MC. At this time, a low-resistive state or a high-resistive state may be obtained by changing the applied voltage to have the set voltage $V_{set}$ or the reset voltage $V_{reset}$ value, and desired information of 1 or 0 may be recorded on the selected memory cell MC.

In a reading operation, reading of the selected memory cell may be performed similarly as above. That is, a gate voltage applied to each of the gates 560 is adjusted so that the channel of the selected memory cell MC is turned off and the channels of the unselected memory cells MC are turned on, and after that, an electric current flowing in the corresponding memory cell MC due to an applied voltage $V_{read}$ between the common source line CSL and the bit line BL is measured to identify the memory cell state (1 or 0).

As described above, the variable resistance memory device 500 according to the embodiment configure the memory cells MC to include the variable resistance layer 530, in which the conductive filament may be easily formed due to the oxygen vacancies, and form the memory device by arranging the memory cells MC. Therefore, the variable resistance layer 530 may be relatively thin as compared with a memory device based on, for example, a phase-change material or a charge-trap, and the variable resistance memory device 500 may have a low operating voltage. The variable resistance memory device 500 may increase a density and may implement a low power consumption by addressing a scaling issue among the memory cells in a next-generation VNAND.

The variable resistance memory device 500 according to the disclosure may be implemented in a memory system and/or as a chip-type memory block to be used as a neuromorphic computing platform or used to construct a neural network.

Figure 16:
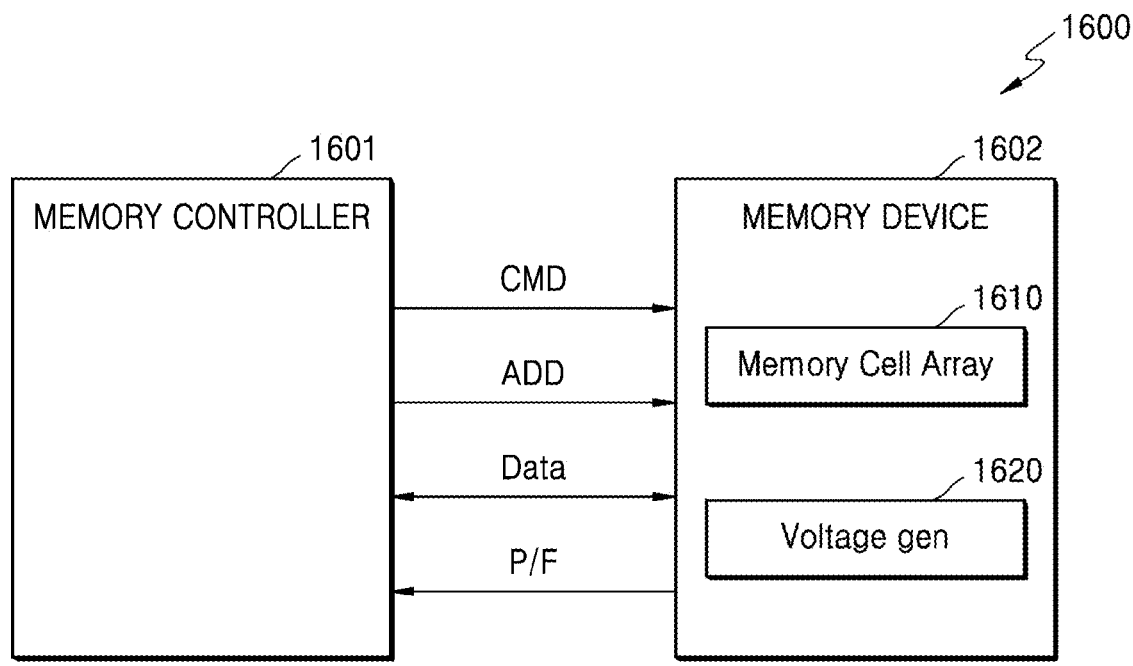
FIG. 16 is a block diagram of a memory system according to an embodiment.

FIG. 16 is a block diagram of a memory system according to an embodiment.

Referring to FIG. 16, the memory system 1600 may include a memory controller 1601 and a memory device 1602. The memory controller 1601 performs a control operation with respect to the memory device 1602, for example, the memory controller 1601 provides the memory device 1602 with an address ADD and a command CMD to perform a programming (or writing), a reading, and/or an erasing operation with respect to the memory device 1602. Also, data for the programming operation and read data may be transmitted between the memory controller 1601 and the memory device 1602.

The memory device 1602 may include a memory cell array 1610 and a voltage generator 1620. The memory cell array 1610 may include a plurality of memory cells that are arranged on regions where a plurality of word lines and a plurality of bit lines intersect with each other. The memory cell array 1610 includes non-volatile memory cells based on the embodiments in FIGS. 1-5 and 8-15 of the present application.

The memory controller 1601 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory controller 1601 may operate in response to requests from a host (not shown) and may be configured to access the memory device 1602 and control operations discussed above (for example for the write/read operations in FIG. 10), thereby transforming the memory controller 1601 into a special purpose controller. The memory controller 1601 may generate an address ADD and a command CMD for performing programming/reading/erasing operations on the memory cell array 1610. Also, in response to commands from the memory controller 1601, the voltage generator 1620 (e.g., power circuit) may generate a voltage control signal for controlling at least one voltage level used in the non-volatile memory device 1602. As an example, the voltage generator 1620 may generate the voltage control signal for controlling a voltage level of a word line for reading data from or programming data on the memory cell array 1610.

In addition, memory controller 1601 may perform a determination operation on the data read from the non-volatile memory device 1602. For example, by determining the data read from the memory cells, the number of on-cells and/or off-cells from among the memory cells may be determined. The memory device 1602 may provide the memory controller 1601 a pass/fail signal P/F according to a read result with respect to the read data. The memory controller 1601 may refer to the pass/fail signal P/F and thus control write and read operations of the memory cell array 1610.

Figure 17:
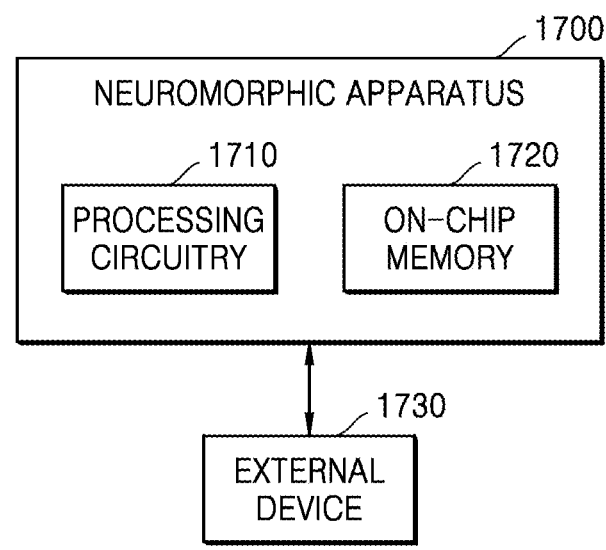
FIG. 17 is a diagram illustrating a neuromorphic apparatus and an external device connected thereto according to an embodiment.

FIG. 17 is a diagram illustrating a neuromorphic apparatus and an external device connected thereto according to an embodiment.

Referring to FIG. 17 a neuromorphic apparatus 1700 may include processing circuitry 1710 and/or memory 1720. The neuromorphic apparatus 1700 may include a memory based on the embodiments in FIGS. 1-5 and 8-16 of the present application.

In some example embodiments, processing circuitry 1710 may be configured to control functions for driving the neuromorphic apparatus 1700. For example, the processing circuitry 1710 may be configured to control the neuromorphic apparatus 1700 by executing programs stored in the memory 1720 of the neuromorphic apparatus 1700. In some example embodiments, the processing circuitry may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic apparatus 1700, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), or the like. In some example embodiments, the processing circuitry 1710 may be configured to read/write various data from/in the external device 1730 and/or execute the neuromorphic apparatus 1700 by using the read/written data. In some embodiments, the external device 1730 may include an external memory and/or sensor array with an image sensor (e.g., CMOS image sensor circuit).

In some embodiments, the neuromorphic apparatus in FIG. 17 may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

While the variable resistance memory device have been particularly shown and described with reference to example embodiments thereof, it will be understood by those of ordinary skill in the art that various changes in form and details may be made therein without departing from the spirit and scope as defined by the following claims. In the specification, many details are described in detail, but they are not provided to limit the scope of the disclosure, and should be interpreted as illustrating the embodiment. Thus, the scope of the disclosure should be determined by the technical idea set forth in the claims, not by the embodiments.

The variable resistance memory device may change the resistance under a low applied voltage.

The variable resistance memory device may show a large variable resistance range.

The variable resistance memory device may be easy to implement low power consumption and high integration density.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A variable resistance memory device comprising:
   a variable resistance layer including a first layer, a second layer, and a third layer,
   the second layer on the first layer,
   the first layer including a first material,
   the second layer including a second material having a valence different from a valence of the first material,
   the third layer on the second layer, the third layer including a third material having a valence different from a valence of the second material; and
   a first conductive element and a second conductive element on the variable resistance layer and separated from each other so that an electric current path is formed in the variable resistance layer in a direction perpendicular to a direction in which the first layer and the second layer are stacked.

2. The variable resistance memory device of claim 1, wherein a difference between the valence of the first material and the valence of the second material is 1 or greater.

3. The variable resistance memory device of claim 1, wherein a difference between a density of the first material and a density of the second material is 1 g/cm³ or greater.

4. The variable resistance memory device of claim 1, wherein the first layer and the third layer include a same material.

5. The variable resistance memory device of claim 1, wherein
the variable resistance layer further includes a fourth layer on the third layer, and
the fourth layer includes a fourth material having a valence that is different from the valence of the third material.

6. The variable resistance memory device of claim 5, wherein the first material is same as the third material.

7. The variable resistance memory device of claim 5, wherein the second material is same as the fourth material.

8. The variable resistance memory device of claim 1, wherein the first material and the second material include oxide materials having a band gap energy of 2 eV or greater.

9. The variable resistance memory device of claim 1, wherein each of the first material and the second material independently include one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

10. A variable resistance memory device comprising:
a support layer including an insulating material;
a variable resistance layer on the support layer, the variable resistance layer including a first layer, and a second layer,
the second layer on the first layer, the first layer including a first material, the second layer including a second material having a valence different from a valence of the first material;
a channel layer on the variable resistance layer;
a gate insulating layer on the channel layer; and
a plurality of gate electrodes on the gate insulating layer, the plurality of gate electrodes being separated from one another, and the plurality of gate electrodes being configured to form an electric current path in the variable resistance layer in a direction perpendicular to a direction in which the first layer and the second layer are stacked.

11. The variable resistance memory device of claim 10, wherein a difference between the valence of the first material and the valence of the second material is 1 or greater.

12. The variable resistance memory device of claim 10, wherein a difference between a density of the first material and a density of the second material is 1 g/cm³ or greater.

13. The variable resistance memory device of claim 10, wherein
each of the first layer and the second layer have a thickness of 10 nm or less, and
the second layer is directly on the first layer.

14. The variable resistance memory device of claim 10, wherein each of the first material and the second material includes oxide materials having a band gap energy of 2 eV or greater.

15. The variable resistance memory device of claim 10, wherein each of the first material and the second material independently include one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, or $MnO_2$.

16. The variable resistance memory device of claim 10, wherein the variable resistance layer, the channel layer and the gate insulating layer are arranged to form a shape of cylindrical pillar of which vertical direction is parallel to a direction along which the plurality of gate electrodes are spaced apart.

17. A variable resistance memory device comprising:
a variable resistance layer including a first layer and a second layer,
the second layer on the first layer,
the first layer including a first material,
the second layer including a second material having a valence different from a valence of the first material;
wherein each of the first layer and, the second layer have a thickness of 10 nm or less; and
a first conductive element and a second conductive element on the variable resistance layer and separated from each other so that an electric current path is formed in the variable resistance layer in a direction perpendicular to a direction in which the first layer and the second layer are stacked.

18. The variable resistance memory device of claim 17, wherein a difference between the valence of the first material and the valence of the second material is 1 or greater.

19. The variable resistance memory device of claim 17, wherein a difference between a density of the first material and a density of the second material is 1 g/cm³ or greater.

20. The variable resistance memory device of claim 17, wherein each of the first material and the second material independently include one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, or $MnO_2$.

* * * * *